United States Patent
Kim

(10) Patent No.: US 8,198,664 B2
(45) Date of Patent: Jun. 12, 2012

(54) SEMICONDUCTOR MEMORY DEVICE HAVING CYLINDER-TYPE CAPACITOR LOWER ELECTRODE AND ASSOCIATED METHODS

(75) Inventor: Gil-sub Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 170 days.

(21) Appl. No.: 12/588,791

(22) Filed: Oct. 28, 2009

(65) Prior Publication Data

US 2010/0200901 A1   Aug. 12, 2010

(30) Foreign Application Priority Data

Feb. 12, 2009   (KR) .................. 10-2009-0011500

(51) Int. Cl.
*H01L 27/108* (2006.01)

(52) U.S. Cl. ............... 257/306; 257/303; 257/E21.014; 257/E28.088; 438/396

(58) Field of Classification Search .................. 257/301, 257/306

See application file for complete search history.

(56) References Cited

U.S. PATENT DOCUMENTS

| | | | | |
|---|---|---|---|---|
| 7,994,561 B2* | 8/2011 | Kim et al. | ...... | 257/307 |
| 2004/0000684 A1* | 1/2004 | Park | ...... | 257/304 |
| 2006/0199332 A1* | 9/2006 | Park et al. | ...... | 438/253 |
| 2007/0001207 A1* | 1/2007 | Graettinger et al. | ...... | 257/302 |
| 2007/0284643 A1* | 12/2007 | Wu | ...... | 257/309 |
| 2008/0023745 A1* | 1/2008 | Lee et al. | ...... | 257/305 |
| 2008/0200024 A1* | 8/2008 | Kong | ...... | 438/636 |
| 2009/0004808 A1* | 1/2009 | Lee et al. | ...... | 438/386 |

FOREIGN PATENT DOCUMENTS

| KR | 10-2002-0006333 A | 1/2002 |
|---|---|---|
| KR | 10-2004-0008419 A | 1/2004 |
| KR | 10-2007-0122050 A | 12/2007 |

* cited by examiner

*Primary Examiner* — Nathan W. Ha
*Assistant Examiner* — Abul Kalam
(74) *Attorney, Agent, or Firm* — Lee & Morse, P.C.

(57) ABSTRACT

A semiconductor memory device including a plurality of supports extending parallel to each other in a first direction on a semiconductor substrate, and capacitor lower electrode rows including a plurality of capacitor lower electrodes arranged in a line along the first direction between two adjacent supports from among the plurality of supports, each capacitor lower electrode including outside walls, wherein each of the capacitor lower electrodes includes two support contact surfaces on the outside walls of the capacitor lower electrode, the support contact surfaces respectively contacting the two adjacent supports from among the plurality of supports.

17 Claims, 10 Drawing Sheets

SEMICONDUCTOR MEMORY DEVICE HAVING CYLINDER-TYPE CAPACITOR LOWER ELECTRODE AND ASSOCIATED METHODS

BACKGROUND

1. Field

Embodiments relate to a semiconductor memory device including a cylinder-type capacitor lower electrode and associated methods.

2. Description of the Related Art

In semiconductor memory devices including a cylinder-type capacitor lower electrode, e.g., dynamic random access memories (DRAMs), a design rule may be reduced. Thus, a height of the capacitor lower electrode may gradually increase in order to secure a sufficient cell capacitance within the limited area of the semiconductor memory device. Accordingly, it may be advantageous to provide semiconductor memory devices having a structure that may efficiently prevent undesirable leaning of the capacitor lower electrode.

SUMMARY

Embodiments are directed to a semiconductor memory device including a cylinder-type capacitor lower electrode and associated methods, which substantially overcome one or more of the drawbacks, limitations and/or disadvantages of the related art.

It is a feature of an embodiment to provide a semiconductor memory device having a structure that prevents leaning of a cylinder-type capacitor lower electrode so as to realize a highly integrated semiconductor memory device having a reduced design rule.

At least one of the above and other features and advantages may be realized by providing a semiconductor memory device including a plurality of supports extending parallel to each other in a first direction on a semiconductor substrate, and capacitor lower electrode rows including a plurality of capacitor lower electrodes arranged in a line along the first direction between two adjacent supports from among the plurality of supports, each capacitor lower electrode including outside walls, wherein each of the capacitor lower electrodes includes two support contact surfaces on the outside walls of the capacitor lower electrode, the support contact surfaces respectively contacting the two adjacent supports from among the plurality of supports.

The capacitor lower electrode rows may be disposed in each space between two adjacent supports from among the plurality of supports.

The plurality of capacitor lower electrodes may include pairs of capacitor lower electrodes disposed at opposite sides of the supports in a second direction perpendicular to the first direction, the pairs of capacitor lower electrodes directly contacting the respective supports.

A distance from the semiconductor substrate to an upper surface of each capacitor lower electrode may be less than or equal to a distance from the semiconductor substrate to an upper surface of each support.

The semiconductor memory device may further include a plurality of bit lines extending parallel to each other in the first direction on the semiconductor substrate, wherein the capacitor lower electrode rows may be disposed above the plurality of bit lines in regions between two adjacent bit lines from among the plurality of bit lines.

The semiconductor memory device may further include a plurality of word lines extending parallel to each other in a second direction perpendicular to the first direction on the semiconductor substrate, wherein the capacitor lower electrodes may each be disposed in a space defined by two adjacent word lines and two corresponding adjacent bit lines.

The semiconductor memory device may further include a plurality of buried contacts disposed between adjacent bit lines and electrically connected to an active region of the semiconductor substrate, wherein each capacitor lower electrode may contact one of the buried contacts.

Each capacitor lower electrode may be directly on the buried contact and may extend in a direction perpendicular to a main surface of the semiconductor substrate such that the buried contact is between the capacitor lower electrode and the semiconductor substrate.

The capacitor lower electrodes may include at least one of a metal and a metal nitride.

At least one of the above and other features and advantages may also be realized by providing a method of manufacturing a semiconductor device including forming a plurality of supports so as to extend parallel to each other in a first direction on a semiconductor substrate, and arranging a plurality of capacitor lower electrode rows, including a plurality of capacitor lower electrodes, in a line along the first direction between two adjacent supports from among the plurality of supports, such that the capacitor lower electrodes each include two support contact surfaces on outside walls of the capacitor lower electrode, and such that the support contact surfaces respectively contact the two adjacent supports from among the plurality of supports.

The arranging the plurality of capacitor lower electrode rows may include disposing the capacitor lower electrode rows in spaces between two adjacent supports from among the plurality of supports.

The plurality of capacitor lower electrode rows may include providing pairs of capacitor lower electrodes at opposite sides of the supports in a second direction perpendicular to the first direction such that the pairs of capacitor lower electrodes directly contact the respective supports.

The arranging the plurality of capacitor lower electrode rows may include configuring the capacitor lower electrodes such that a distance from the semiconductor substrate to an upper surface of each capacitor lower electrode is less than or equal to a distance from the semiconductor substrate to an upper surface of each support.

The method may further include forming a plurality of word lines on the semiconductor substrate extending parallel to each other in a second direction perpendicular to the first direction such that the capacitor lower electrodes are each disposed in a space defined by two adjacent word lines and two corresponding adjacent bit lines.

The method may further include forming a plurality of buried contacts between adjacent bit lines and electrically connected to an active region of the semiconductor substrate such that each capacitor lower electrode contacts one of the buried contacts.

The arranging the plurality of capacitor lower electrode rows and the forming the plurality of buried contacts may be performed such that each capacitor lower electrode is directly on the buried contact and extends in a direction perpendicular to a main surface of the semiconductor substrate and such that the buried contact is between the capacitor lower electrode and the semiconductor substrate.

The capacitor lower electrodes may include at least one of a metal and a metal nitride.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
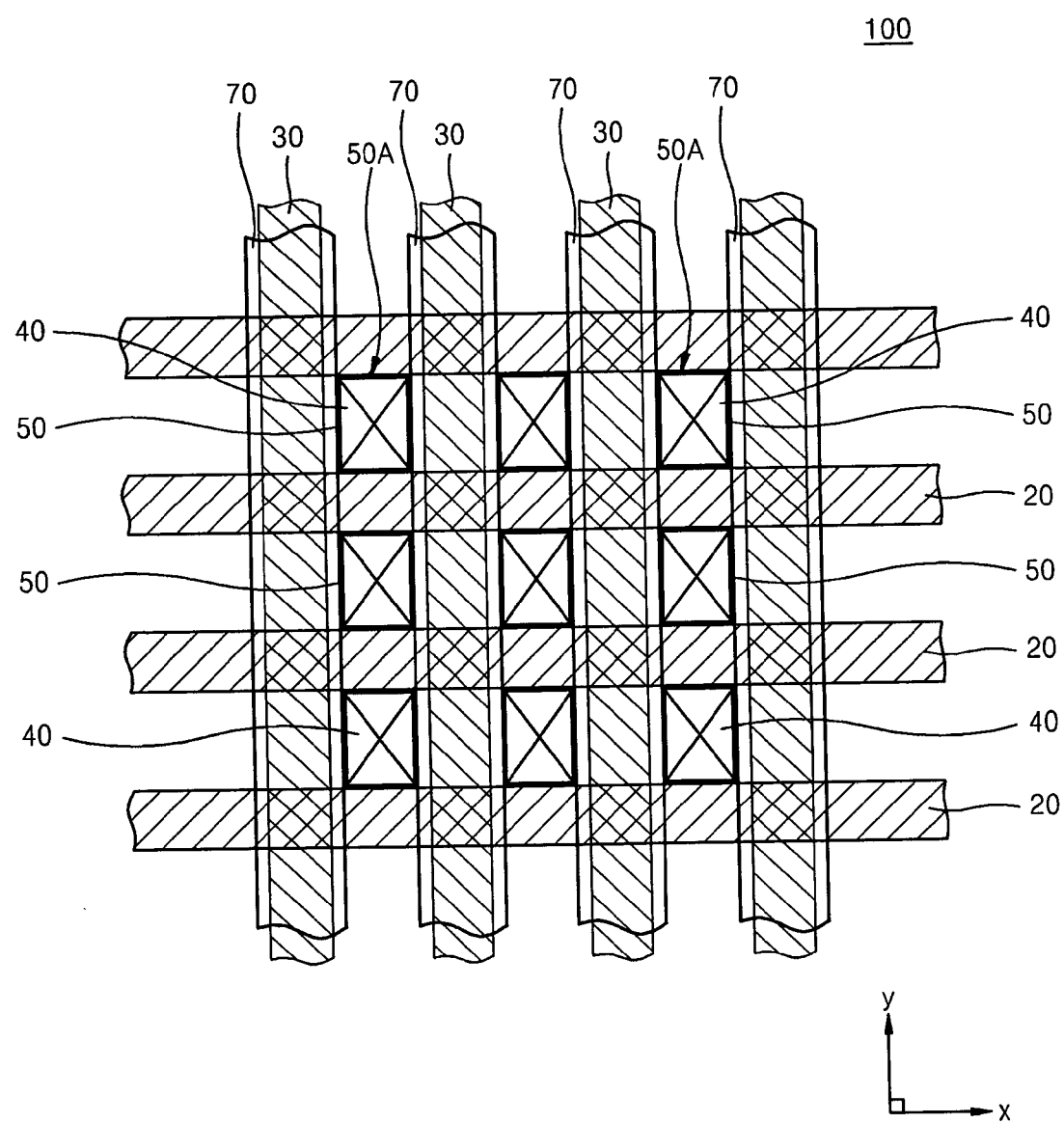
FIG. 1 illustrates a layout of a part of a cell array region of a semiconductor memory device according to an embodiment.

Korean Patent Application No. 10-2009-0011500, filed on Feb. 12, 2009, in the Korean Intellectual Property Office, and entitled: "Semiconductor Memory Device Having Cylinder-Type Lower Electrode of Capacitor," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
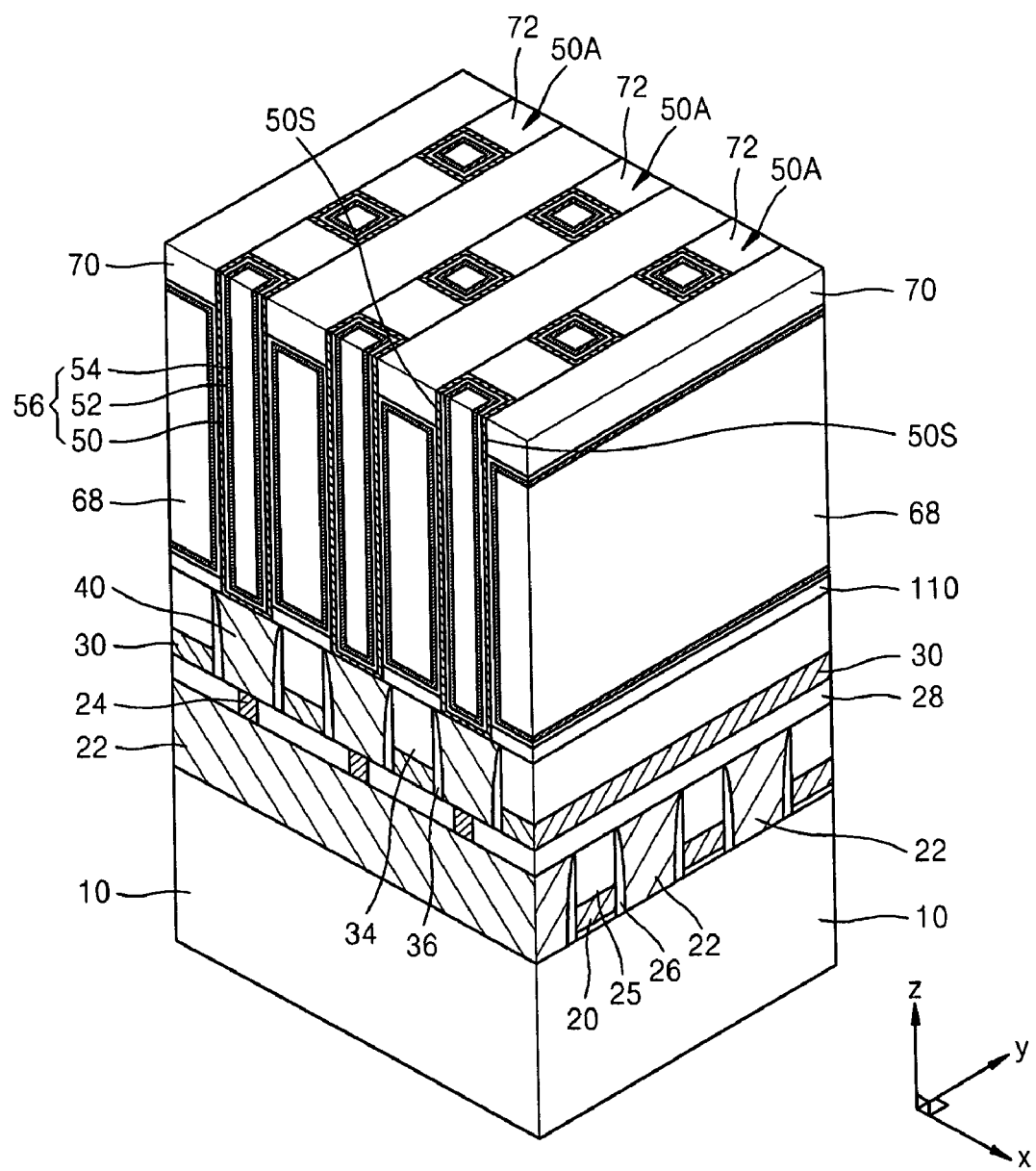
FIG. 2 illustrates a perspective view of the part of the cell array region of the semiconductor memory device of FIG. 1.

FIG. 1 illustrates a layout view of a part of a cell array region of a semiconductor memory device 100 according to an embodiment. FIG. 2 illustrates a perspective view of the part of the cell array region of the semiconductor memory device 100 of FIG. 1 in which a y direction will be referred to as the first direction, an x direction as the second direction, and a z direction as the third direction.

Referring to FIGS. 1 and 2, a plurality of word lines 20, which may form memory cells in a cell array region on a semiconductor substrate 10, may extend parallel to each other in the second direction (the x direction in FIGS. 1 and 2). A plurality of bit lines 30, disposed on the plurality of word lines 20, may extend parallel to each other in the first direction (the y direction in FIGS. 1 and 2), perpendicular to the second direction.

A plurality of buried contacts 40 may be disposed in spaces between the plurality of bit lines 30. The plurality of buried contacts 40 may be electrically connected to an active region of a semiconductor substrate 10 through self-aligned contacts 22 and contacts 24. The active region may be disposed between the plurality of word lines 20. The plurality of buried contacts 40 may be self-aligned with one another by the plurality of bit lines 30.

A plurality of capacitors 56 may be disposed on the plurality of buried contacts 40. Each capacitor 56 may include a capacitor lower electrode 50, a dielectric film 52, and an upper electrode 54. The capacitor lower electrode 50 may each have a cylinder-shaped structure and may be vertically aligned with the buried contacts 40. In other words, the capacitor lower electrode 50 may be directly on the buried contacts 40 and aligned in the third direction (the z direction in FIG. 2) perpendicular to a main surface of the semiconductor substrate 10.

A plurality of supports 70 may extend parallel to each other above the plurality of bit lines 30 and the plurality of buried contacts 40. As illustrated in FIGS. 1 and 2, the plurality of supports 70 may be formed as a plurality of line patterns which may extend parallel to the plurality of bit lines 30 along the first direction. However, the extending direction of the plurality of supports 70 illustrated in FIGS. 1 and 2 is only an example and the plurality of supports 70 may extend in a direction different from the direction of the plurality of bit lines 30.

The capacitor lower electrodes 50 may each be disposed in spaces between two adjacent bit lines 30 and two adjacent word lines 20 from among the bit lines 30 and the adjacent word lines 20. The capacitor lower electrodes 50 may be arranged in a plurality of capacitor lower electrode rows 50A aligned along the second direction. As illustrated in FIGS. 1 and 2, the plurality of capacitor lower electrodes 50 may be arranged in a line so as to not mismatch to each other in one capacitor lower electrode row 50A. The capacitor lower electrode rows 50A may be disposed in each space between pairs of adjacent supports 70. A pair of support contact surfaces 50S on outside walls of each of the capacitor lower electrodes 50 may respectively contact the pair of adjacent supports 70.

In addition, the capacitor lower electrodes 50 may be disposed one by one at both sides of a support 70 along the second direction perpendicular to the extending direction of the support 70. The capacitor lower electrodes 50 may each directly contact the support 70. The plurality of supports 70 may be disposed near upper surfaces of the capacitor lower electrodes 50 so that a distance from the semiconductor substrate 10 to the upper surfaces of the capacitor lower electrodes 50 is not greater than a distance from the semiconductor substrate 10 to upper surfaces of the supports 70.

In FIG. 2, reference numerals "25", "26", "28", "34", "36", "68," and "72" designate insulator films.

In the semiconductor memory device 100 according to the present embodiment, the plurality of capacitor lower electrodes 50 may be supported by sides of two adjacent supports 70 that respectively contact the two support contact surfaces 50S on outside walls of the capacitor lower electrodes 50. Thus, when cylinder-type capacitor lower electrodes 50 having a large aspect ratio in a highly scaled semiconductor memory device are formed in a highly integrated semiconductor memory device, sufficient cell capacitance may be secured in limited cell areas, and undesirable leaning of the capacitor lower electrodes 50 may be efficiently prevented. Leaning of a capacitor lower electrode may result in an undesirable bridge effect in a semiconductor memory device.

FIGS. 3A through 3H illustrate perspective views sequentially showing stages in a method of manufacturing a semiconductor memory device according to an embodiment. In FIGS. 3A through 3H, the same reference numerals as in FIGS. 1 and 2 denote the same elements and thus a repeated detailed description thereof is omitted.

Figure 3A:
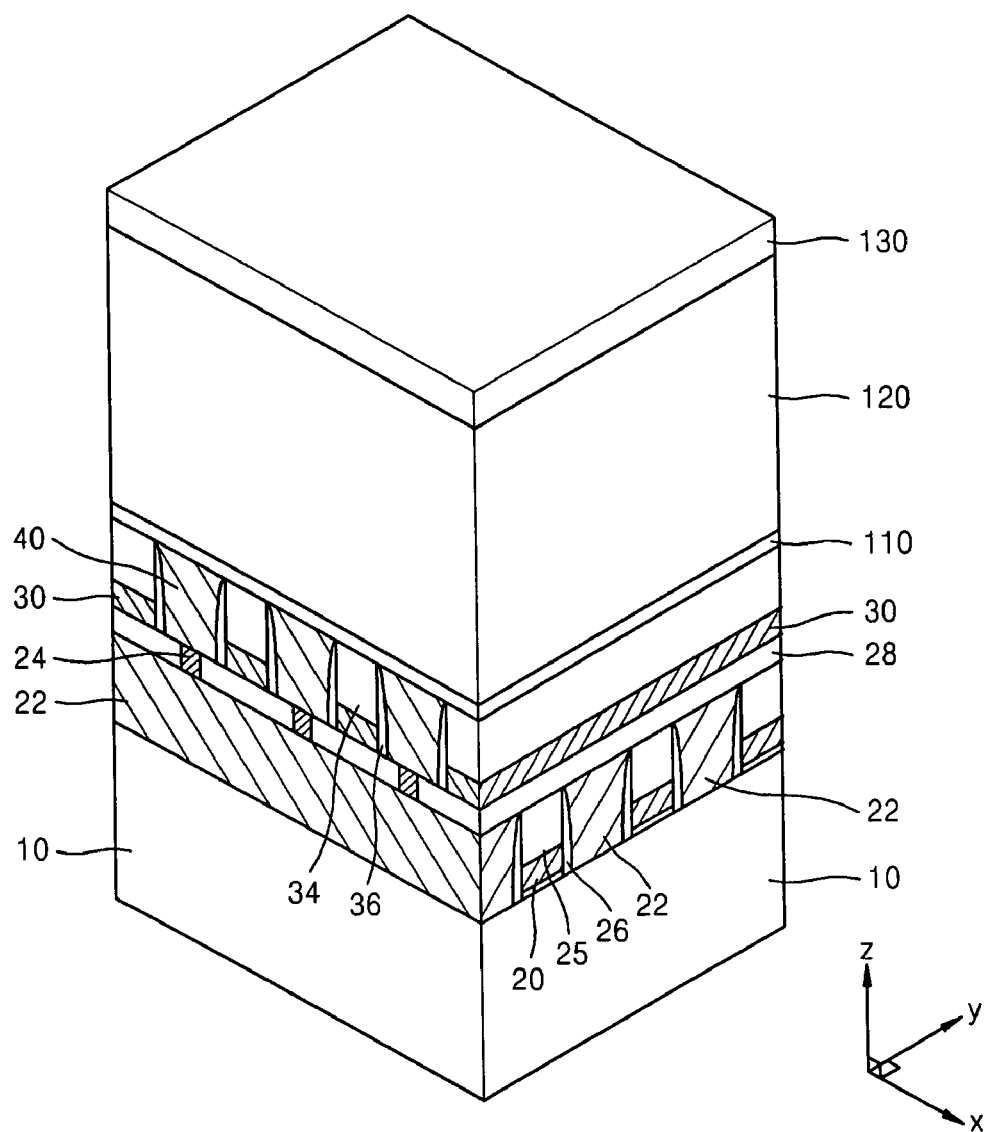
FIGS. 3A through 3H illustrate perspective views of stages of a method of manufacturing a semiconductor memory device according to an embodiment.

Referring to FIG. 3A, a structure including a plurality of word lines 20, a plurality of self-aligned contacts 22, a plurality of bit lines 30, and a plurality of buried contacts 40 on a semiconductor substrate 10 may be formed.

Then, an etching prevention layer 110, a mold layer 120, and a support insulator layer 130 may be sequentially formed in that order on an entire surface of a resultant structure in which upper surfaces of the plurality of buried contacts 40 are exposed. The etching prevention layer 110, the mold layer 120, and the support insulator layer 130 may be respectively formed as, e.g., a nitride layer, an oxide layer, and a nitride layer.

Figure 3B:
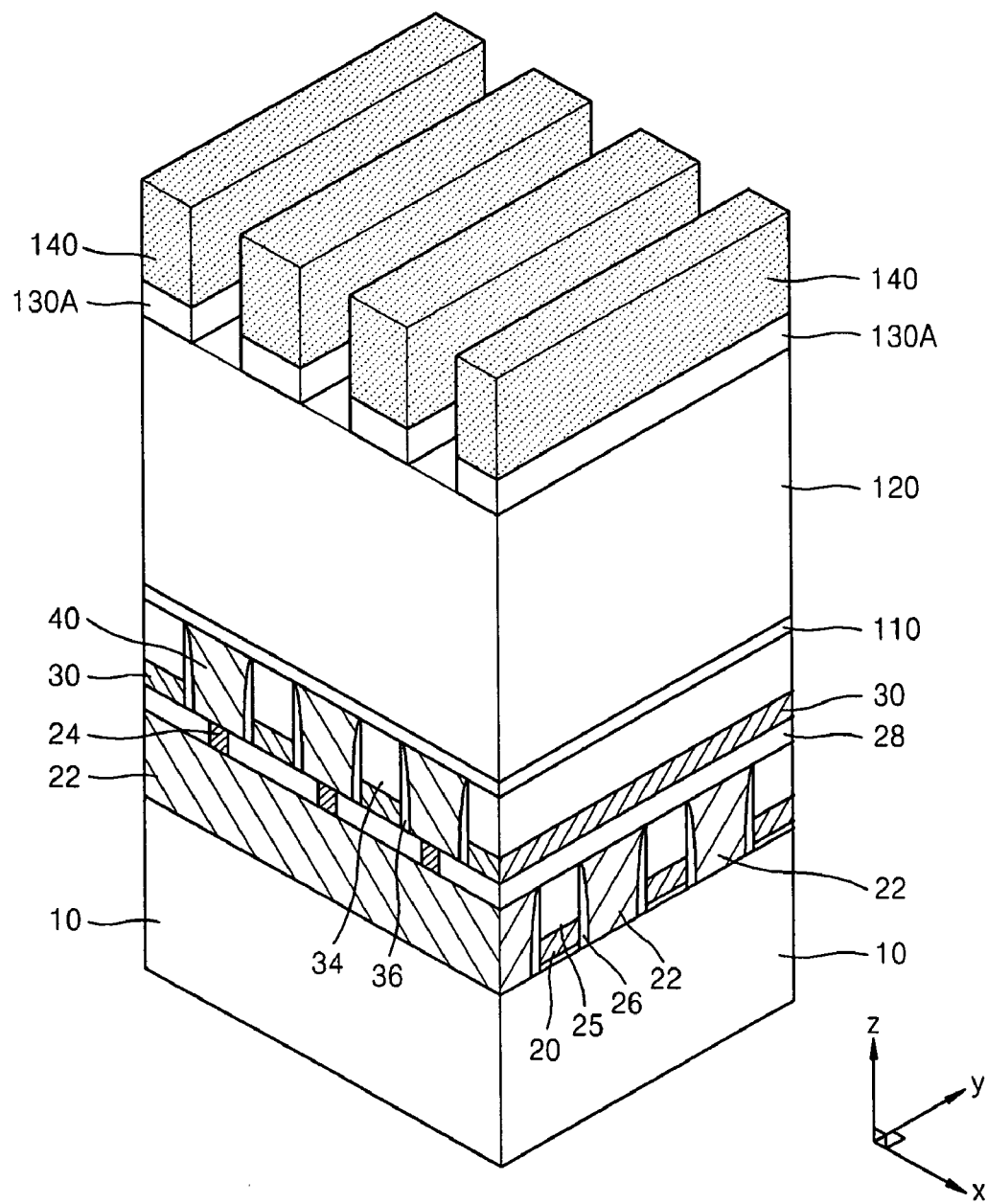

Referring to FIG. 3B, first hard mask patterns 140 may be formed on the support insulator layer 130 using, e.g., a photolithography method. The first hard mask patterns 140 may include a material having an etching selectivity with respect to the mold layer 120 and the support insulator layer 130, e.g., polysilicon.

Then, the support insulator layer 130 may be etched using the first hard mask patterns 140 as an etching mask, forming a plurality of supports 130A extending as a plurality of line patterns parallel to each other in the first direction. The plurality of supports 130A may later form the plurality of supports 70 illustrated in FIGS. 1 and 2.

Figure 3C:
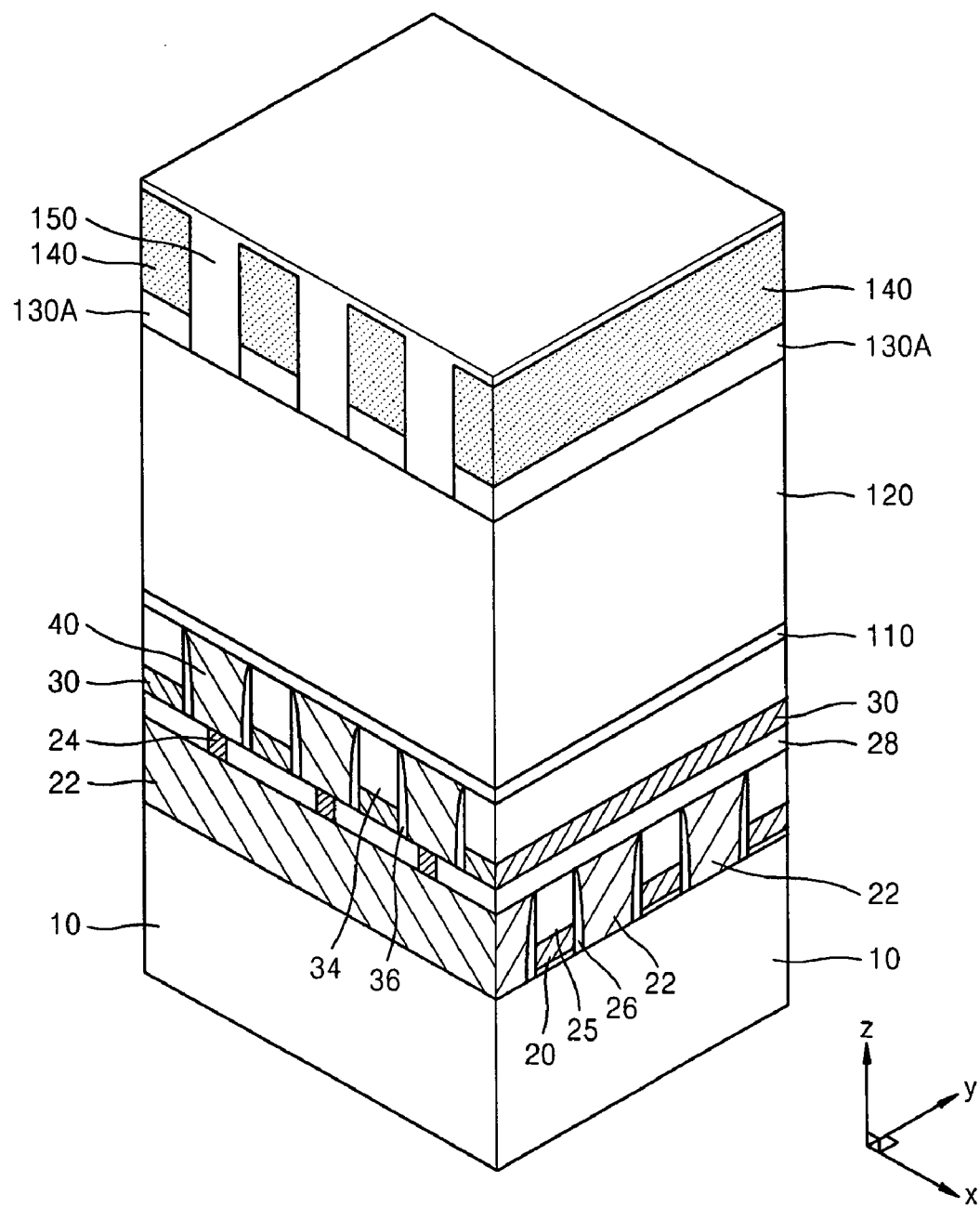

Referring to FIG. 3C, a planarized sacrificial insulator film 150 may be formed on the resultant structure including the plurality of supports 130A. The sacrificial insulator film 150 may completely fill gaps between the plurality of supports 130A. The sacrificial insulator film 150 include a material having excellent gap-filling characteristics, e.g., boro-phospho-silicate glass (BPSG), high density plasma (HDP) oxide, plasma enhanced oxide (PEOX), and/or polysilazane-based inorganic spin-on-glass layer (Tonen SilaZene (TOSZ)). A chemical mechanical polishing (CMP) process may be used to planarize the sacrificial insulator film 150.

In FIG. 3C, the sacrificial insulator film 150 has been formed, and upper surfaces of the first hard mask patterns 140 may not be exposed. However, the sacrificial insulator film 150 may be formed such that the upper surfaces of the first hard mask patterns 140 may be exposed. In addition, as illustrated in FIG. 3C, the sacrificial insulator film 150 may be formed on the first hard mask patterns 140. However, in an implementation, the sacrificial insulator film 150 may be first formed directly on the plurality of supports 130A and then the first hard mask patterns 140 may be formed.

Figure 3D:
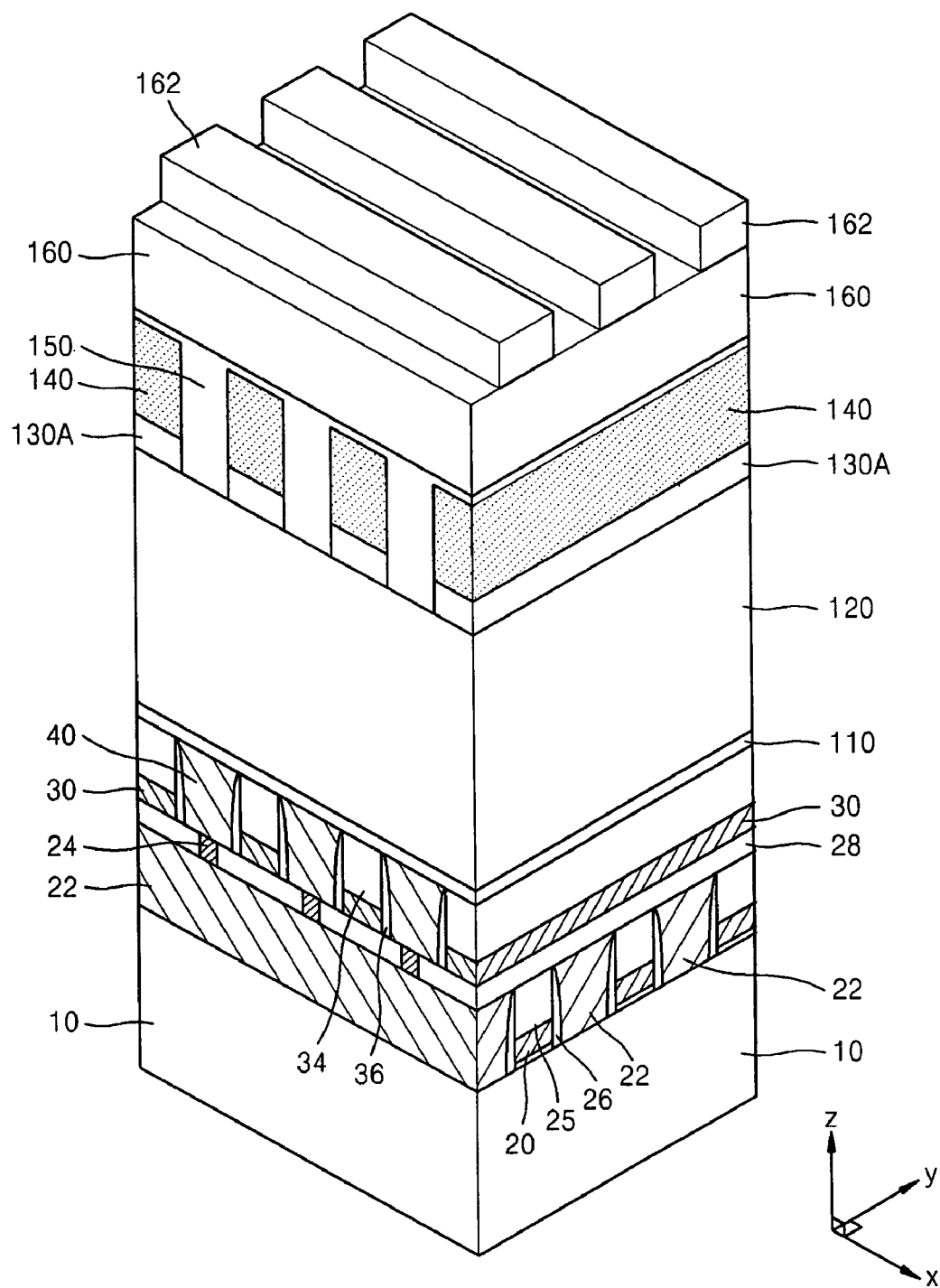

Referring to FIG. 3D, a second hard mask layer 160 may be formed on the sacrificial insulator film 150. Photoresist patterns 162 may be formed on the second hard mask layer 160.

The photoresist patterns 162 may be formed as a plurality of line patterns extending parallel to each other in the second direction. The second hard mask layer 160 may include a material having an etching selectivity with respect to the mold layer 120 and the sacrificial insulator film 150. In addition, the second hard mask layer 160 may include a material that is different from the material in the first hard mask patterns 140. The second hard mask layer 160 may include, e.g., an amorphous carbon layer (ACL) or a carbon-containing layer.

The second hard mask layer 160 may be formed using, e.g., a spin coating process or a chemical vapor deposition (CVD) process. For example, a process of forming the second hard mask layer 160 using the carbon-containing layer may be as follows. First, an organic compound layer having a thickness of about 1000 Å to about 5000 Å may be formed on the sacrificial insulator film 150. Here, a spin coating process or another deposition process may be used. The organic compound may be a hydrocarbon compound including an aromatic ring, e.g., phenyl, benzene, or naphthalene, or a derivative of such a hydrocarbon compound. The organic compound may include materials having relative high carbon content, e.g., about 85% to about 99%, based on the total amount of the organic compound. The organic compound layer may be baked at a temperature of about 150° C. to about 350° C. to manufacture the carbon-containing layer. The first baking process may be performed for about 60 seconds. Then, the carbon-containing layer may be baked at a temperature of about 300° C. to about 550° C. to be hardened. The second baking process may be performed for about 30 second to about 300 seconds. As described above, as the carbon-containing layer may be hardened by the second baking process, although a deposition process may be performed under a high temperature of about 400° C. to form a layer on the carbon-containing layer, the carbon-containing layer may not be affected during the subsequent deposition process.

Figure 3E:
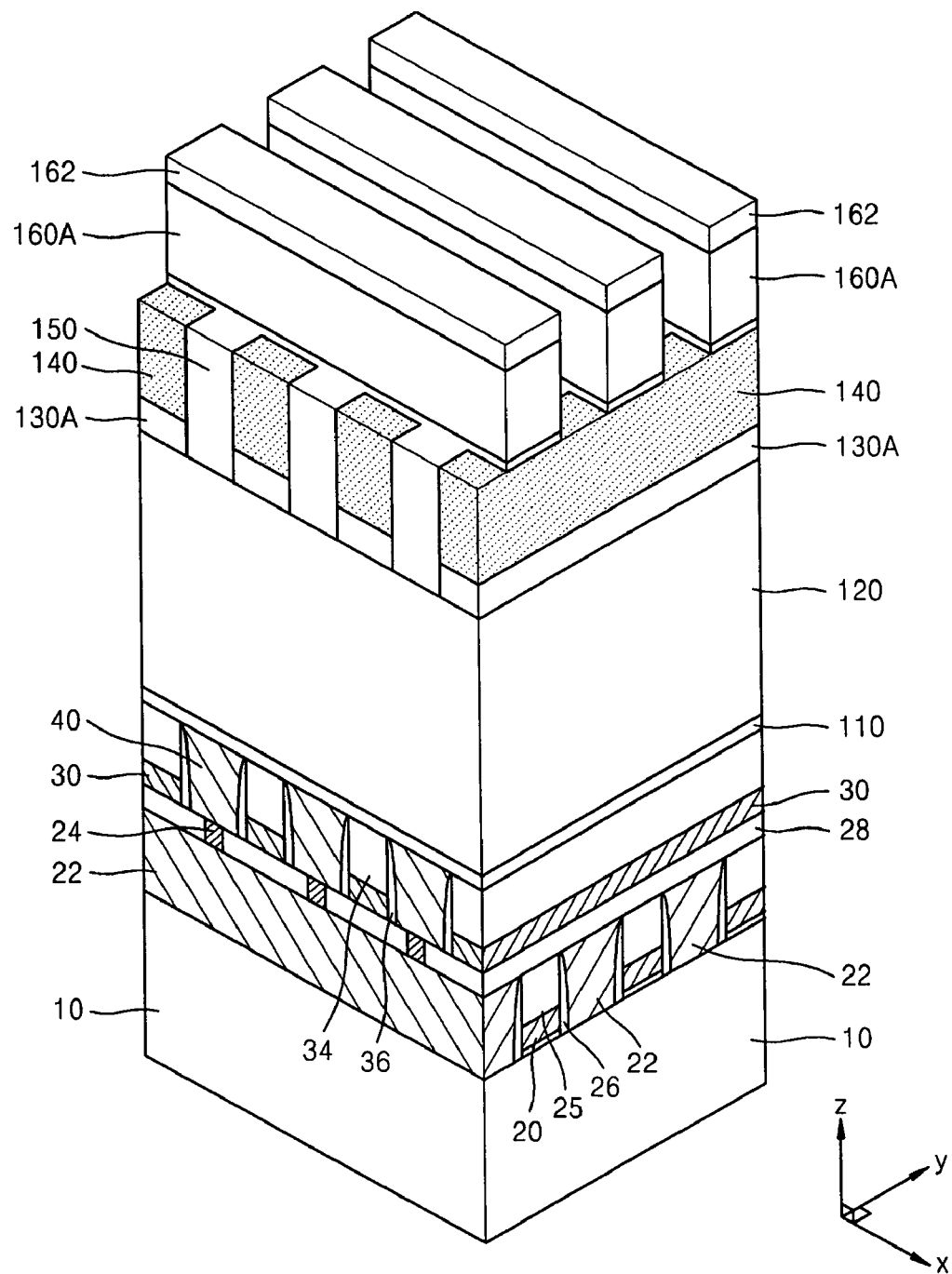

Referring to FIG. 3E, the second hard mask layer 160 may be etched using the photoresist patterns 162 as an etching mask. Thus, second hard mask patterns 160A may be formed on the sacrificial insulator film 150.

The second hard mask patterns 160A may be formed as a plurality of line patterns extending parallel to each other in the first direction. The sacrificial insulator film 150 may be etched during over-etching of the second hard mask layer 160 until the first hard mask patterns 140 are exposed through spaces between the second hard mask patterns 160A. Although not illustrated in FIG. 3E, since part of the sacrificial insulator film 150 may be removed during over-etching of the second hard mask layer 160, parts of the exposed first hard mask patterns 140 may be also removed at a predetermined thickness from upper surfaces thereof by over-etching.

Figure 3F:
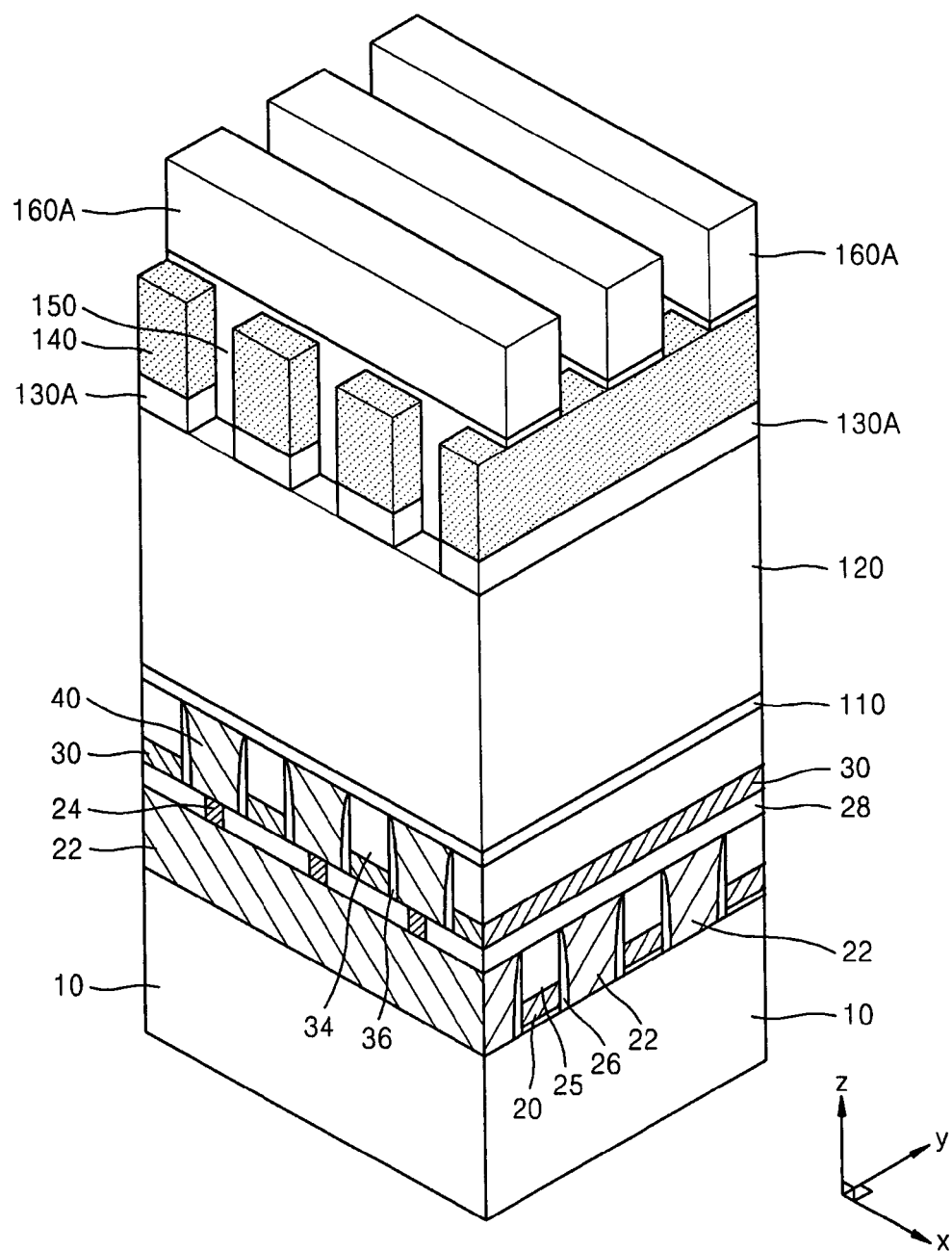

Referring to FIG. 3F, after the photoresist patterns 162 are removed, exposed portions of the sacrificial insulator film 150 may be etched using the first hard mask patterns 140 and the second hard mask patterns 160A as an etching mask. An upper surface of the mold layer 120 and side walls of the supports 130A may thereby be exposed.

While the sacrificial insulator film 150 is etched, the first hard mask patterns 140 and the second hard mask patterns 160A may be removed at a predetermined thickness from the upper surfaces thereof.

Figure 3G:
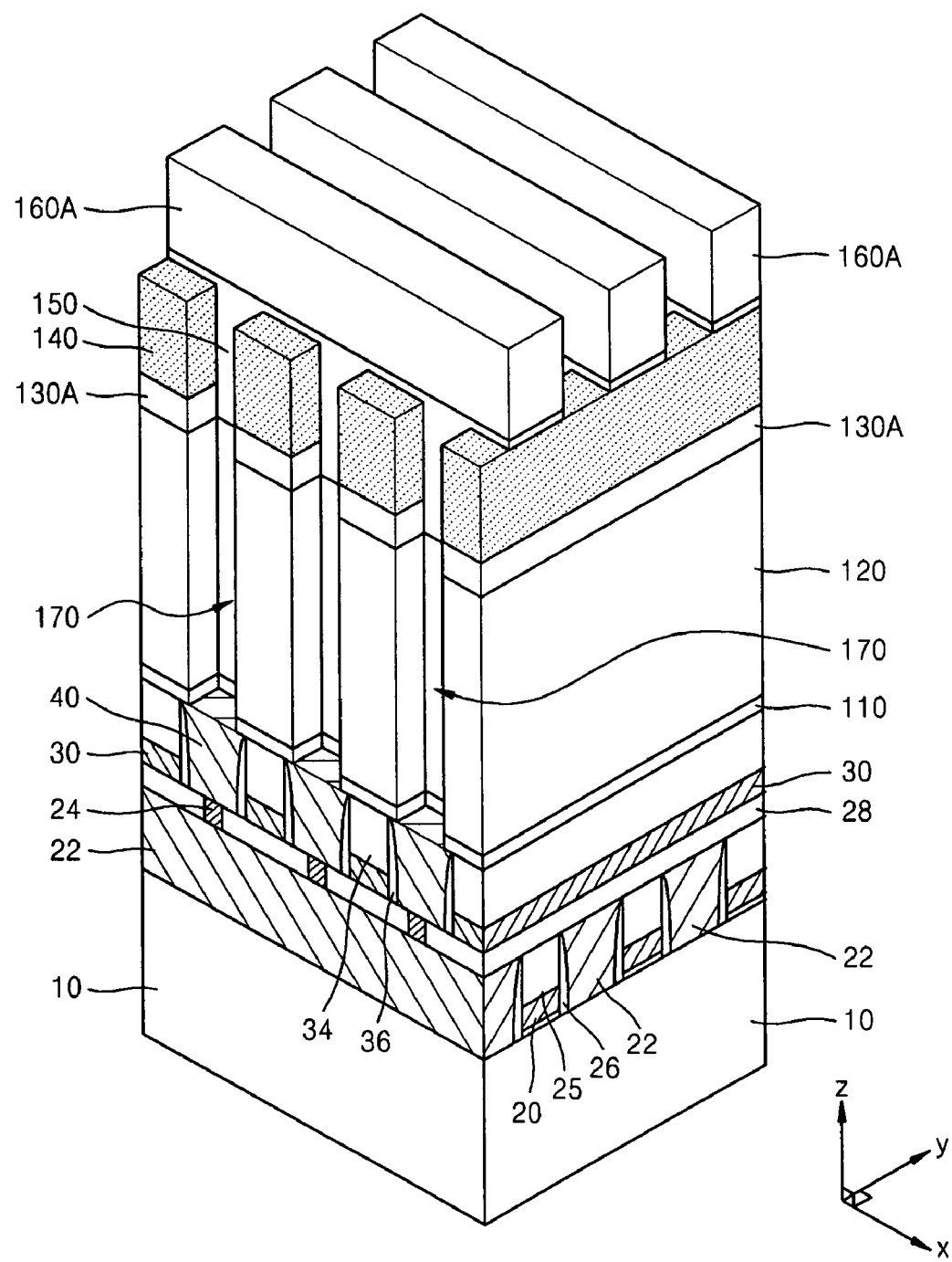

Referring to FIG. 3G, exposed portions of the mold layer 120 may be etched using the first hard mask patterns 140 and the second hard mask patterns 160A as an etching mask to form a plurality of storage node holes 170 in the mold layer 120. Here, the etching prevention layer 110 may be used as an etch-stop layer. The etching process for forming the plurality of storage node holes 170 may be performed until upper surfaces of the buried contacts 40 are exposed.

While the mold layer 120 is etched, the first hard mask patterns 140 and the second hard mask patterns 160A may be removed at a predetermined thickness from the upper surfaces thereof.

Figure 3H:
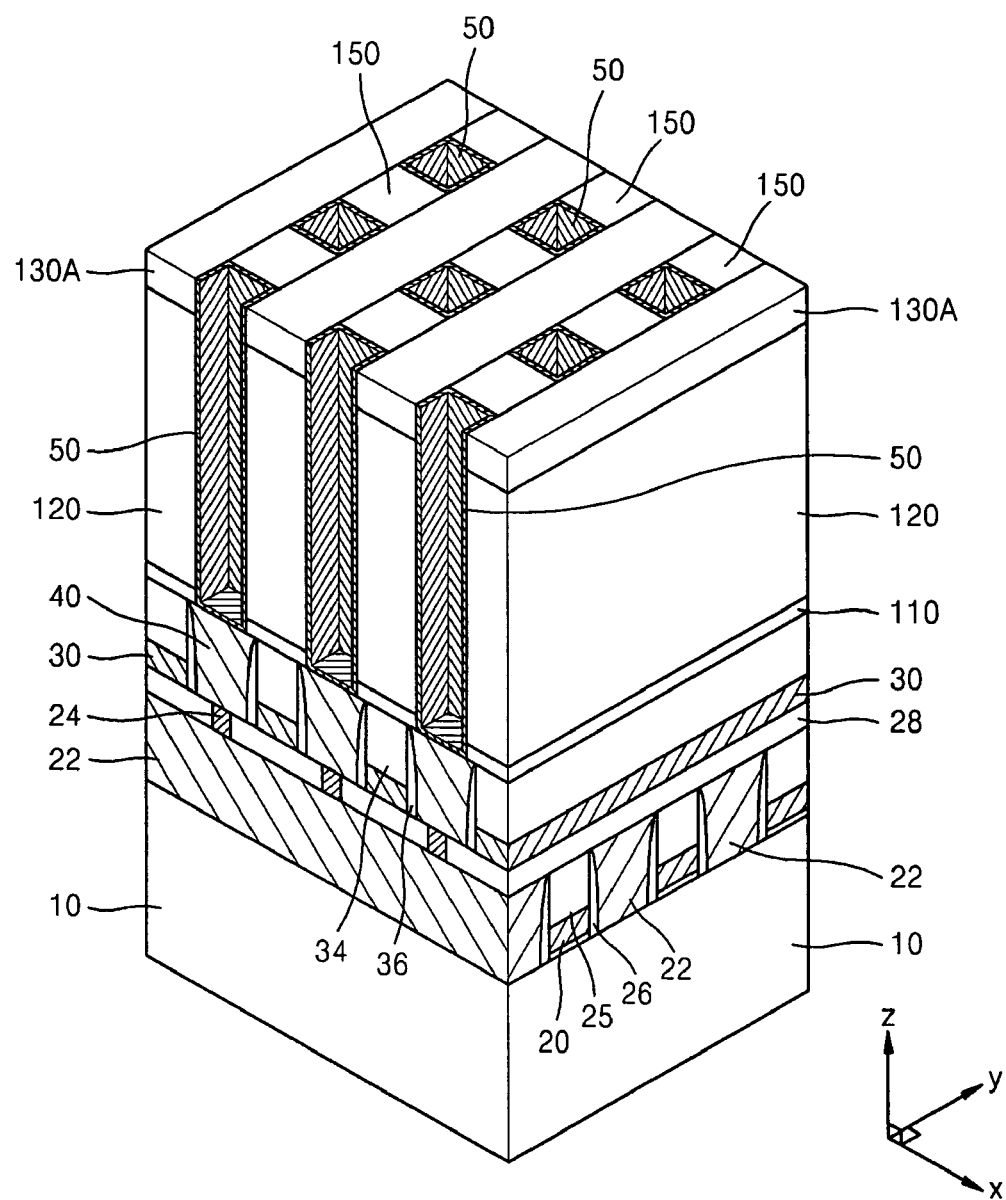

Referring to FIG. 3H, after the first hard mask patterns 140 and the second hard mask patterns 160A are removed, conductive layers may be respectively deposited on inner walls of the plurality of storage node holes 170. The resultant structure including the conductive layers on inner walls of the plurality of storage node holes 170 may be etched back until upper surfaces of the plurality of supports 130A are exposed. This may form the plurality of capacitor lower electrodes 50 as residual layers of the conductive layers remaining in the plurality of storage node holes 170. The plurality of capacitor lower electrodes 50 may be same plurality of capacitor lower electrodes 50 illustrated in FIGS. 1 and 2.

The plurality of capacitor lower electrodes 50 may have a structure in which a layer is formed of, e.g., Ti or TiN, or a structure in which, e.g., Ti and TiN, are sequentially stacked (a Ti/TiN structure). For example, when the buried contacts 40 are formed of a metal, the plurality of capacitor lower electrodes 50 may include TiN. Alternatively, when the buried contacts 40 are formed of conductive polysilicon, the plurality of capacitor lower electrodes 50 may include a Ti/TiN structure.

Then the sacrificial insulator film 150 and the mold layer 120 may be removed by, e.g., a wet etching process. For example, in order to remove the sacrificial insulator film 150 and the mold layer 120, a lift-off process using HF, LAL (HF+NH$_4$F+pure water), or a combination thereof may be used.

After the sacrificial insulator film 150 and the mold layer 120 are removed, the dielectric films 52 and the upper electrodes 54 (refer to FIG. 2) may be sequentially formed in that order on the plurality of capacitor lower electrodes 50 and the surfaces of the supports 130A. This may complete manufacture of the cylinder-type capacitor lower electrode 50 as illustrated in FIG. 2.

In the method of manufacturing the semiconductor memory device according to the present embodiment, the first hard mask patterns 140 formed by a photolithography process may first be used as an etching mask to form the supports 130A for preventing undesirable leaning of the capacitor lower electrodes 50. Then, the first hard mask patterns 140 used as an etching mask in forming of the supports 130A and the second hard mask patterns 160A formed by another photolithography process may be simultaneously used as an etching mask to perform an etching process for forming the plurality of storage node holes 170. As described above, the same photolithography process may be performed twice to form the plurality of storage node holes 170 for forming the supports 130A and the capacitor lower electrodes 50, so that the frequency of photolithography processes may be reduced. When compared with a typical method of manufacturing a semiconductor memory device, this may increase productivity.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
   a plurality of supports extending parallel to each other in a first direction on a semiconductor substrate;
   capacitor lower electrode rows including a plurality of capacitor lower electrodes arranged in a line along the first direction between two adjacent supports from among the plurality of supports, each capacitor lower electrode including outside walls, and
   a plurality of bit lines extending parallel to each other in the first direction on the semiconductor substrate, wherein the capacitor lower electrode rows are disposed above the plurality of bit lines in regions between two adjacent bit lines from among the plurality of bit lines,
   wherein each of the capacitor lower electrodes includes two support contact surfaces on the outside walls of the capacitor lower electrode, the support contact surfaces respectively contacting the two adjacent supports from among the plurality of supports,
   wherein a distance from the semiconductor substrate to an upper surface of each capacitor lower electrode is less than or equal to a distance from the semiconductor substrate to an upper surface of each support, and
   wherein each of the plurality of supports has a first width in a second direction perpendicular to the first direction, each of the plurality of bit lines has a second width in the second direction, and the first width is greater than the second width.

2. The semiconductor memory device as claimed in claim 1, wherein the capacitor lower electrode rows are disposed in each space between two adjacent supports from among the plurality of supports.

3. The semiconductor memory device as claimed in claim 1, wherein the plurality of capacitor lower electrodes includes pairs of capacitor lower electrodes disposed at opposite sides of the supports in a second direction perpendicular to the first direction, the pairs of capacitor lower electrodes directly contacting the respective supports.

4. The semiconductor memory device as claimed in claim 1, further comprising a plurality of word lines extending parallel to each other in a second direction perpendicular to the first direction on the semiconductor substrate, wherein the capacitor lower electrodes are each disposed in a space defined by two adjacent word lines and two corresponding adjacent bit lines.

5. The semiconductor memory device as claimed in claim 1, further comprising a plurality of buried contacts disposed between adjacent bit lines and electrically connected to an active region of the semiconductor substrate, wherein each capacitor lower electrode contacts one of the buried contacts.

6. The semiconductor memory device as claimed in claim 5, wherein each capacitor lower electrode is directly on the buried contact and extends in a direction perpendicular to a main surface of the semiconductor substrate such that the buried contact is between the capacitor lower electrode and the semiconductor substrate.

7. The semiconductor memory device as claimed in claim 1, wherein the capacitor lower electrodes include at least one of a metal and a metal nitride.

8. The semiconductor memory device as claimed in claim 1, wherein the capacitor lower electrodes are cylinder-type capacitor lower electrodes, and
   wherein the two adjacent supports contact the respective outside walls of three or more of the cylinder-type capacitor lower electrodes.

9. A method of manufacturing a semiconductor device, comprising:
   forming a plurality of supports so as to extend parallel to each other in a first direction on a semiconductor substrate;
   arranging a plurality of capacitor lower electrode rows, including a plurality of capacitor lower electrodes, in a line along the first direction between two adjacent supports from among the plurality of supports, such that the capacitor lower electrodes each include two support contact surfaces on outside walls of the capacitor lower electrode, and such that the support contact surfaces respectively contact the two adjacent supports from among the plurality of supports, and
   forming a plurality of bit lines extending parallel to each other in the first direction on the semiconductor substrate, wherein the capacitor lower electrode rows are disposed above the plurality of bit lines in regions between two adjacent bit lines from among the plurality of bit lines,
   wherein the arranging the plurality of capacitor lower electrode rows includes configuring the capacitor lower electrodes such that a distance from the semiconductor substrate to an upper surface of each capacitor lower electrode is less than or equal to a distance from the semiconductor substrate to an upper surface of each support, and wherein forming the plurality of supports includes configuring each of the plurality of supports to have a first width in a second direction perpendicular to the first direction, forming the plurality of bit lines includes configuring each of the plurality of bit lines to have a second width in the second direction, and the first width is greater than the second width.

10. The method as claimed in claim 9, wherein the arranging the plurality of capacitor lower electrode rows includes disposing the capacitor lower electrode rows in spaces between two adjacent supports from among the plurality of supports.

11. The method as claimed in claim 9, wherein the arranging the plurality of capacitor lower electrode rows includes providing pairs of capacitor lower electrodes at opposite sides of the supports in a second direction perpendicular to the first direction such that the pairs of capacitor lower electrodes directly contact the respective supports.

12. The method as claimed in claim 9, wherein the capacitor lower electrodes include at least one of a metal and a metal nitride.

13. The method as claimed in claim 9, further comprising:
forming a plurality of word lines on the semiconductor substrate extending parallel to each other in a second direction perpendicular to the first direction such that the capacitor lower electrodes are each disposed in a space defined by two adjacent word lines and two corresponding adjacent bit lines.

14. The method as claimed in claim 9, further comprising:
forming a plurality of buried contacts between adjacent bit lines and electrically connected to an active region of the semiconductor substrate such that each capacitor lower electrode contacts one of the buried contacts.

15. The method as claimed in claim 14, wherein the arranging the plurality of capacitor lower electrode rows and the forming the plurality of buried contacts are performed such that each capacitor lower electrode is directly on the buried contact and extends in a direction perpendicular to a main surface of the semiconductor substrate and such that the buried contact is between the capacitor lower electrode and the semiconductor substrate.

16. The method as claimed in claim 9, wherein the capacitor lower electrodes are cylinder-type capacitor lower electrodes, and wherein the plurality of cylinder-type capacitor lower electrodes are arranged such that the two adjacent supports contact the respective outside walls of three or more of the cylinder-type capacitor lower electrodes.

17. A method of manufacturing a semiconductor device, comprising:
forming a mold layer on a semiconductor substrate;
forming a support insulator layer on the mold layer;
forming a plurality of first hard mask patterns extending parallel to each other in a first direction on the support insulator layer;
etching portions of the support insulator layer to form a plurality of supports extending parallel to each other in the first direction on the mold layer;
forming a sacrificial insulator film completely filling gaps between the plurality of supports;
forming a plurality of second hard mask patterns extending parallel to each other in a second direction perpendicular to the first direction on the sacrificial insulator film;
etching portions of the sacrificial insulator film and the mold layer using the plurality of first hard mask patterns and the plurality of second hard mask patterns as an etching mask to form a plurality of storage node holes in the mold layer;
forming a plurality of capacitor lower electrode rows, including a plurality of capacitor lower electrodes, arranged in a line along the first direction between two adjacent supports from among the plurality of supports, such that the capacitor lower electrodes each include two support contact surfaces on outside walls of the capacitor lower electrode, and such that the support contact surfaces respectively contact the two adjacent supports from among the plurality of supports; and
forming a plurality of bit lines extending parallel to each other in the first direction on the semiconductor substrate, wherein the capacitor lower electrode rows are disposed above the plurality of bit lines in regions between two adjacent bit lines from among the plurality of bit lines, and wherein etching portions of the support insulator layer to form the plurality of supports includes configuring each of the plurality of supports to have a first width in a second direction perpendicular to the first direction, forming the plurality of bit lines includes configuring each of the plurality of bit lines to have a second width in the second direction, and the first width is greater than the second width.

\* \* \* \* \*